United States Patent
Ge et al.

(10) Patent No.: US 8,901,722 B2
(45) Date of Patent: Dec. 2, 2014

(54) SEMICONDUCTOR DEVICE WITH INTEGRAL HEAT SINK

(71) Applicants: You Ge, Tianjin (CN); Meng Kong Lye, Shah Alam (MY); Penglin Mei, Tianjin (CN)

(72) Inventors: You Ge, Tianjin (CN); Meng Kong Lye, Shah Alam (MY); Penglin Mei, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/077,205

(22) Filed: Nov. 11, 2013

(65) Prior Publication Data

US 2014/0239476 A1 Aug. 28, 2014

(51) Int. Cl.
*H01L 23/34* (2006.01)
*H01L 21/48* (2006.01)

(52) U.S. Cl.
CPC ............ *H01L 23/34* (2013.01); *H01L 21/4878* (2013.01)
USPC .......................................... 257/666; 257/690

(58) Field of Classification Search
USPC ............................ 257/666, 690, 712; 438/122
See application file for complete search history.

(56) References Cited

U.S. PATENT DOCUMENTS

| | | | |
|---|---|---|---|
| 3,930,114 A | 12/1975 | Hodge | |
| 5,041,902 A | 8/1991 | McShane | |
| 5,072,283 A | 12/1991 | Bolger | |
| 5,679,975 A * | 10/1997 | Wyland et al. | 257/659 |
| 5,723,899 A * | 3/1998 | Shin | 257/666 |
| 6,918,178 B2 | 7/2005 | Chao | |
| 7,009,283 B1 | 3/2006 | de Simone | |
| 7,902,644 B2 * | 3/2011 | Huang et al. | 257/660 |
| 8,211,753 B2 | 7/2012 | Ramakrishna | |
| 2003/0160313 A1 * | 8/2003 | Ichihashi et al. | 257/678 |

* cited by examiner

*Primary Examiner* — Roy Potter
(74) *Attorney, Agent, or Firm* — Charles Bergere

(57) ABSTRACT

A packaged semiconductor device has opposing first and second main surfaces and a sidewall connecting the first and second main surfaces. A semiconductor die is embedded in the package and has a first main surface facing the first main surface of the package and an opposing second main surface facing the second main surface of the package. Conductive leads are electrically coupled to the semiconductor die, each of which is partially embedded within the package and extends outside of the package from the package sidewall. At least one tie bar is partially embedded within the package and has an exposed segment extending outside of the package from the sidewall. A portion of the exposed segment is in contact with the first main surface of the package. The tie bar forms a heat sink to dissipate heat generated by the semiconductor die.

19 Claims, 3 Drawing Sheets

US 8,901,722 B2

SEMICONDUCTOR DEVICE WITH INTEGRAL HEAT SINK

BACKGROUND OF THE INVENTION

The present invention is directed to a semiconductor device and more particularly to a semiconductor device with an integral heat sink.

In current semiconductor device packaging, thermal dissipation paths for heat generated by the encapsulated semiconductor die are limited. Typically, the heat is conducted through the packaging to the top surface of the package, where it is then dissipated to the environment. In addition, heat may also be conducted, for example via an exposed pad, to a circuit board on which the package is mounted. The heat is then conducted through the circuit board and thereafter is dissipated to the environment.

However, such limited heat conduction and dissipation paths may not be sufficient to adequately cool the semiconductor die, which can lead to overheating and damage or destruction of the device. At the same time, smaller sizes and profiles for semiconductor packages, such as Quad Flat Packages (QFP) and Small Outline Integrated Circuits (SOIC), are constantly being sought as technological devices utilizing the semiconductor packages continue to shrink, thereby shrinking the available area for heat dissipation.

A common solution has been to add a separate heat sink to the device to improve thermal performance. This requires additional materials and attachment steps that can increase the production time and cost, and can also result in the size of the completed package being larger than desired.

It is therefore desirable to provide a semiconductor device that allows for more efficient cooling of the contained semiconductor die, but which does not require the attachment of separate heat sinks.

BRIEF DESCRIPTION OF THE SEVERAL VIEWS OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION OF THE INVENTION

In one embodiment, the present invention provides a semiconductor device including a package having opposing first and second main surfaces and a sidewall connecting the first and second main surfaces. A semiconductor die is embedded in the package and has a first main surface facing the first main surface of the package and an opposing second main surface facing the second main surface of the package. A plurality of conductive leads are electrically coupled to the semiconductor die, each of which is partially embedded within the package and extends outside of the package from the sidewall thereof. There is at least one tie bar partially embedded within the package that has an exposed segment extending outside of the package from the sidewall. A portion of the exposed segment is in contact with the first main surface of the package. The at least one tie bar forms a heat sink to conduct or dissipate heat generated by the semiconductor die.

In another embodiment, the present invention provides a method of assembling a semiconductor device, including the steps of providing a lead frame having a plurality of conductive leads and coupled to a support by at least one tie bar; electrically coupling a semiconductor die to each of the plurality of conductive leads on the lead frame; embedding the semiconductor die, a portion of the at least one tie bar, and portions of the plurality of conductive leads in a packaging material to form a package having a first main surface, an opposing second main surface, and a sidewall connecting the first and second main surfaces, the plurality of conductive leads and the at least one tie bar extending outside of the package through the sidewall thereof; severing the at least one tie bar from the support; and bending an exposed segment of the at least one tie bar until a portion of the exposed segment is in contact with the first main surface of the package, wherein the at least one tie bar forms a heat sink to conduct heat generated by the semiconductor die.

Figures 1, 2:
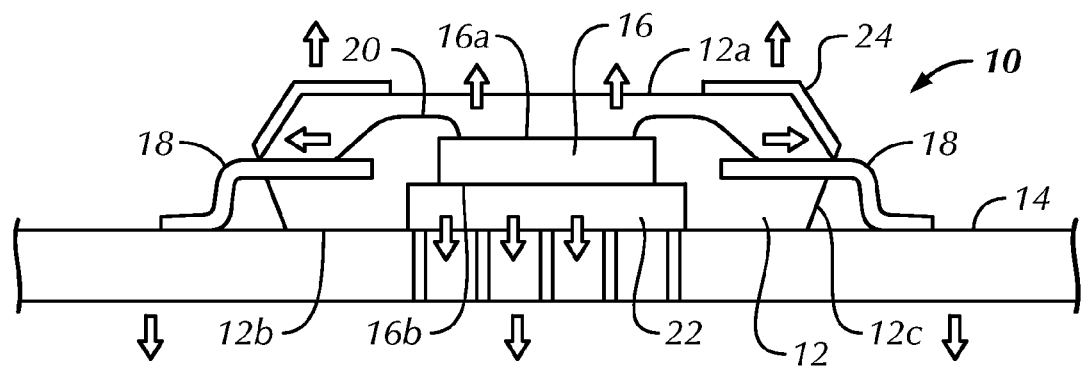
FIG. 1 is a cross-sectional side elevational view of a semiconductor device in accordance with an embodiment of the invention.
FIG. 2 is a top plan view of the semiconductor device of FIG. 1.

Referring now to the drawings, wherein the same reference numerals are used to designate the same components throughout the several figures, there is shown in FIG. 1 a semiconductor device 10 in accordance with an embodiment of the invention. The semiconductor device 10 includes a package 12 having a first main surface 12a and an opposing second main surface 12b. A sidewall 12c connects the first and second main surfaces 12a, 12b and may extend perpendicularly to one or both of the first and second main surfaces 12a, 12b. The second main surface 12b is conventionally mounted proximate to or in contact with a circuit board 14. The package 12 may be constructed from a mold compound, such as a plastic or polymeric material, or the like.

A semiconductor die 16 is embedded in the package 12. The semiconductor die 16 is typically in the form of an integrated circuit (IC) or the like. The semiconductor die 16 may be made from any semiconductor material or combinations of materials, such as gallium arsenide, silicon germanium, silicon-on-insulator (SOI), silicon, monocrystalline silicon, the like, and combinations of the above. It is preferred that the semiconductor die 16 include a first main surface 16a and an opposing second main surface 16b. Each of the first and second main surfaces 16a, 16b of the semiconductor die 16 preferably faces a respective one of the first and second main surfaces 12a, 12b of the package 12.

The semiconductor die 16 is electrically coupled to a plurality of conductive leads 18 that are each partially embedded in the package 12. The material of the leads may be a base material layer of copper (Cu) that is coated, alloyed or preplated with a metal layer or layers such as gold (AU), nickel (Ni), palladium (PD), tin (Sn) or the like. However, other like conductive materials may be used to form the conductive leads 18. The number and shapes of the conductive leads 18 may be varied as necessary depending on the type of the semiconductor die 16, the configuration of the circuit board 14, the shape of the package 12, and other like factors. It is particularly preferred that the conductive leads 18 extend outside of the package 12 from the sidewall 12c thereof, although arrangements wherein one or more of the conductive leads 18 emerges from the first or second main surface 12a, 12b of the package 12 may also be used in accordance with embodiments of the invention.

The electrical connection between the semiconductor die 16 and the individual leads 18 is preferably made with wires 20 through a wire bonding process. However, direct connections of the conductive leads 18 to the semiconductor die 16 are also contemplated. The wires 20 are preferably in the form of gold wires, although other materials may be used.

In certain embodiments, the device 10 may further include a pad 22 that is coupled to the semiconductor die 16 and which may be exposed at the second main surface 12b of the package 12. For example, the pad 22 may be electrically connected to the semiconductor die 16 to allow for interconnection with leads, vias, or other structures on the circuit board 14 that are located beneath the second main surface 12b of the package 12 when the device 10 is mounted on the circuit board 14. The pad 22 may be made from copper (Cu) and/or other conductive materials, and may be coated, alloyed or pre-plated with a metal layer or layers such as gold (AU), nickel (Ni), palladium (PD), tin (Sn) or the like. The semiconductor die 16 is preferably bonded to the pad 22 using an adhesive, such as an epoxy material. However, other methods of securing the semiconductor die 16 to the pad 22 may be used, such as mechanical or other fasteners or the like.

Figure 4:
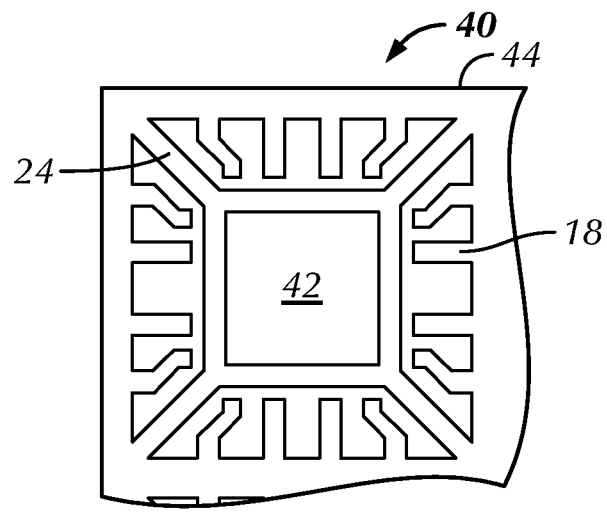
FIG. 4 is a top plan view of a lead frame and support for forming a semiconductor device in accordance with an embodiment of the invention.

The device 10 preferably includes at least one tie bar 24 that, in accordance with embodiments of the invention, serves as an integral heat sink for the device 10. Tie bars 24 are utilized during the manufacturing process to hold lead frames 40 to a common support 44, as can be seen in FIG. 4. Typically, after individual lead frames 40 are singulated, the tie bars 24 are removed or cut off. It has been found that retaining the tie bars 24 and applying them to the first main surface 12a of the package 12 provides an integral heat sink, giving the device 10 additional heat dissipation paths (shown schematically by the arrows in FIG. 1) that increase thermal dissipation efficiency. The tie bars 24 are typically made from the same material as the lead frame 40, and are preferably made from copper (Cu), aluminium (Al), or other materials with good heat conductance.

In the completed device 10, the tie bars 24 are partially embedded within the package 12, with an exposed segment 25 (see FIG. 3) extending outside of the package 12 from the sidewall 12c thereof. In particular, it is advantageous if the tie bars 24 are located in a region of the package 12 that does not interfere with the conductive leads 18 or the connections to the semiconductor die 16. Thus, in packages 12 where the sidewall 12c forms a plurality of corners 30 (see e.g., FIG. 2), it is preferred that a tie bar 24 is located at each of the corners 30, since the corners 30 are free of the conductive leads 18. In a preferred embodiment, shown in FIG. 2, the package 12 has a square or rectangular shape, with four corners 30 and a tie bar 24 located at each corner 30.

A portion of the exposed segment 25 of each tie bar 24 is in direct contact with, and preferably fixedly attached directly to, the first main surface 12a of the package 12. An adhesive 32 may be used for this purpose, although mechanical or other fasteners or the like may be used as well. In a preferred embodiment shown in FIGS. 2 and 3, a groove 34 having a thickness which generally corresponds to the thickness of the tie bar 24 is provided in the first main surface 12a of the package 12 to accommodate the portion of the exposed segment 25 of the tie bar 24. In this manner, the device 10 can have a flat profile.

In order to obtain the best results of heat conduction and dissipation, it is preferable to maximize the exposed surface area of the tie bar 24, and in particular the portion of the exposed segment 25 that contacts the first main surface 12a of the package 12. Thus, the exposed segment 25 of the tie bar 24 may have differing widths between the point from which the tie bar 24 extends out of the sidewall 12c of the package to an end point of the tie bar 24. In the embodiment shown in FIG. 2, an end of the exposed segment 25 of the tie bar 24 has the general shape of a square, while the portion of the exposed segment 25 connecting the square to the sidewall 12c of the package 12 (see FIG. 3) is a thinner rectangular-type shape. Of course, other shapes may be used as well. For example, the end of the exposed segment 25 of the tie bar 24 may be cut into a circular or oval shape, a polygonal shape, or the like.

A method for making the device 10 will now be described with respect to FIGS. 2 and 4-7. Referring to first to FIG. 4, a lead frame 40 is provided for the device 10 that includes the plurality of conductive leads 18 appropriately sized and spaced according to the desired specifications of the completed device 10. The plurality of leads 18, in the example shown in FIG. 4, preferably surround a die flag 42 connected at each corner to a support 44 by the tie bars 24. The die flag 42 is configured to receive the semiconductor die 16. In addition, the die flag 42 may include or form the die pad 22, which can be electrically connected to the semiconductor die 16 through direct bonding, electrical interconnectors (not shown), or the like.

Figure 5:
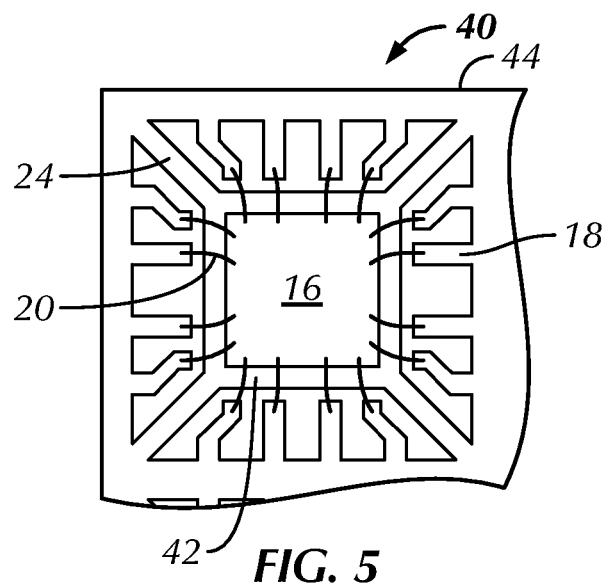
FIG. 5 is a top plan view of the lead frame and support of FIG. 4 with a die and wire bonding added.

In FIG. 5, the semiconductor die 16 has been placed into position on the die flag 42 and now can be electrically coupled to each of the plurality of conductive leads 18 on the lead frame 40. As described above, the electrical interconnection is preferably made by wire bonding, using gold wires 20 or the like.

Figure 6:
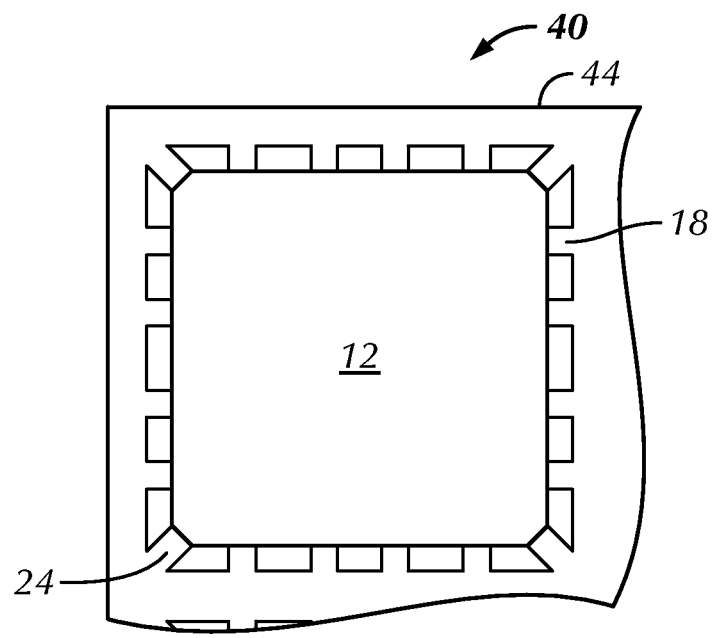
FIG. 6 is a top plan view of the lead frame and support of FIG. 5 following encapsulation.

As shown in FIG. 6, the semiconductor die 16, the wires 20, and portions of each of the conductive leads 18 are encapsulated by a molding compound material that forms the package 12. The encapsulation process can be done in one or more stages, as is conventionally known. In addition, at least a portion of each tie bar 24 is encapsulated, preferably at corners of the package 12 formed during the encapsulation process. The die pad 22 may also be exposed during the encapsulation process by preventing the deposit of the encapsulation material thereon. Alternatively, the die pad 22 may subsequently be exposed by the selective removal of encapsulation material.

Figure 7:
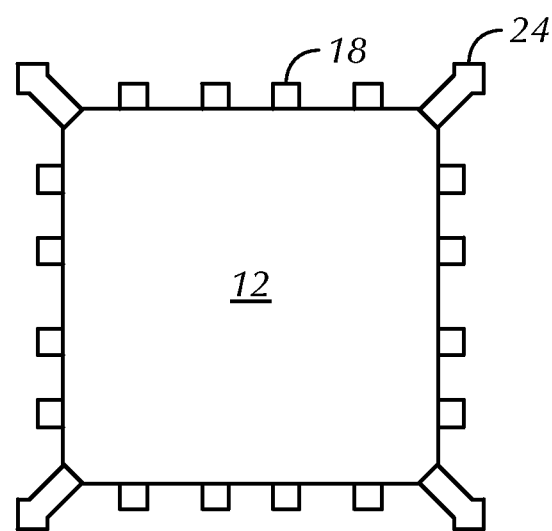
FIG. 7 is a top plan view of a device severed from the lead frame and support of FIG. 6.

Once the package 12 is formed, in FIG. 7 the device 10 may be removed from the support 44 by severing the tie bars 24 and the conductive leads 18 from the support 44. This process may be performed by saw or punch singulation, or other known singulation methods. The singulation process also provides the opportunity to shape the exposed segments 25 of the tie bars 24 as desired. The shaping and severing may occur simultaneously, although it is possible to subsequently shape the severed tie bars 24 after the initial singulation process is completed.

Figure 3:
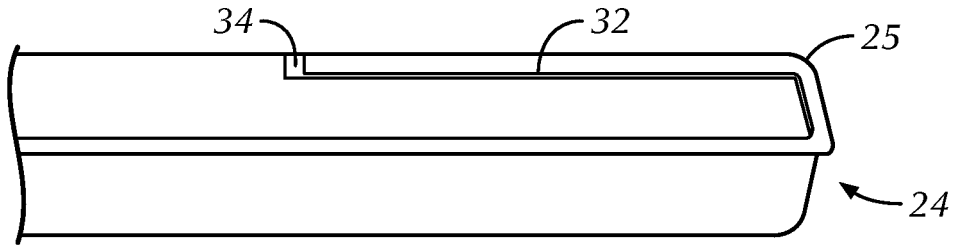
FIG. 3 is an enlarged cross-sectional side elevational view of the device of FIG. 2 taken along line A-A of FIG. 2.

Once the tie bars 24 are severed and shaped appropriately, the exposed segments 25 of the tie bars 24 are bent until a portion thereof is in contact with the first main surface 12a of the package 12, for example, as shown in FIGS. 2 and 3. Prior to or following bending, the adhesive 32 may be applied for fixed attachment. In addition, the grooves 34 may be formed at any time following the encapsulation process by conventional techniques such as etching or the like.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A semiconductor device, comprising:
   a package having opposing first and second main surfaces and a sidewall connecting the first and second main surfaces;
   a semiconductor die embedded in the package and having a first main surface facing the first main surface of the package and an opposing second main surface facing the second main surface of the package;
   a plurality of conductive leads electrically coupled to the semiconductor die, each of which is partially embedded within the package and extends outside of the package from the sidewall thereof; and
   at least one tie bar partially embedded within the package and having an exposed segment extending outside of the package from the sidewall, a portion of the exposed segment being in contact with the first main surface of the package, wherein the at least one tie bar forms a heat sink to conduct heat generated by the semiconductor die.

2. The semiconductor device of claim 1, wherein the portion of the exposed segment in contact with the first main surface of the package is fixedly attached to the first main surface of the package.

3. The semiconductor device of claim 2, further comprising an adhesive configured to fixedly attach the portion of the exposed segment to the first main surface of the package.

4. The semiconductor device of claim 1, wherein the sidewall of the package forms a plurality of corners, and wherein a tie bar is located at each of the plurality of corners.

5. The semiconductor device of claim 1, wherein the exposed segment of the at least one tie bar includes a first portion having a first width and a second portion having a second width, the first width being greater than the second width.

6. The semiconductor device of claim 1, wherein the first main surface of the package includes a groove receiving the at least one tie bar.

7. A semiconductor device, comprising:
   a package having opposing first and second main surfaces and a sidewall connecting the first and second main surfaces;
   a semiconductor die embedded in the package and having a first main surface facing the first main surface of the package and an opposing second main surface facing the second main surface of the package;
   a plurality of conductive leads electrically coupled to the semiconductor die, each of which is partially embedded within the package and extends outside of the package from the sidewall thereof; and
   at least one tie bar partially embedded within the package and having an exposed segment extending outside of the package from the sidewall, a portion of the exposed segment being in contact with and fixedly attached to the first main surface of the package, wherein the at least one tie bar forms a heat sink to conduct heat generated by the semiconductor die.

8. The semiconductor device of claim 7, wherein the sidewall of the package forms a plurality of corners, and a tie bar is located at each of the plurality of corners.

9. The semiconductor device of claim 7, wherein the exposed segment of the at least one tie bar includes a first portion having a first width and a second portion having a second width, the first width being greater than the second width.

10. The semiconductor device of claim 7, wherein the first main surface of the package includes a groove receiving the at least one tie bar.

11. A method of assembling a semiconductor device, the method comprising:
    providing a lead frame having a plurality of conductive leads and coupled to a support by at least one tie bar;
    electrically coupling a semiconductor die to each of the plurality of conductive leads on the lead frame;
    embedding the semiconductor die, a portion of the at least one tie bar, and portions of the plurality of conductive leads in a packaging material to form a package having a first main surface, an opposing second main surface, and a sidewall connecting the first and second main surfaces, the plurality of conductive leads and the at least one tie bar extending outside of the package through the sidewall thereof;
    severing the at least one tie bar from the support; and
    bending an exposed segment of the at least one tie bar until a portion of the exposed segment is in contact with the first main surface of the package, wherein the at least one tie bar forms a heat sink to conduct heat generated by the semiconductor die.

12. The method of claim 11, further comprising fixedly attaching, to the first main surface of the package, the portion of the exposed segment of the at least on tie bar in contact with the first main surface of the package.

13. The method of claim 12, wherein the step of fixedly attaching comprises applying an adhesive between the first main surface of the package and the portion of the exposed segment of the at least one tie bar in contact with the first main surface of the package.

14. The method of claim 11 further comprising shaping the exposed segment of the at least one tie bar.

15. The method of claim 14, wherein the shaping occurs simultaneously with or after the severing of the at least one tie bar from the support.

16. The method of claim 14, wherein the exposed segment of the at least tie bar is shaped to have a first portion having a first width and a second portion having a second width, the first width being greater than the second width.

17. The method of claim 11, further comprising forming a groove in the first main surface of the package.

18. The method of claim 17, wherein the contact of the portion of the exposed segment of the at least one tie bar is made with the first main surface of the package in the groove.

19. The method of claim 11, wherein the lead frame includes four tie bars, and the step of embedding includes forming corners in the sidewall of the package such that each corner is located proximate one of the four tie bars.

* * * * *